(12) United States Patent
Vaufrey

(10) Patent No.: US 8,309,947 B2
(45) Date of Patent: Nov. 13, 2012

(54) HIGH EFFICIENCY HYBRID LIGHT-EMITTING DIODE

(75) Inventor: David Vaufrey, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 64 days.

(21) Appl. No.: 13/043,185

(22) Filed: Mar. 8, 2011

(65) Prior Publication Data

US 2011/0227036 A1 Sep. 22, 2011

(30) Foreign Application Priority Data

Mar. 16, 2010 (FR) ...................................... 10 01045

(51) Int. Cl.
 *H01L 33/00* (2010.01)
(52) U.S. Cl. ................... 257/13; 257/E33.008
(58) Field of Classification Search ............. 257/12–15, 257/70–81, 98–99, E33.08
See application file for complete search history.

(56) References Cited

U.S. PATENT DOCUMENTS

| | | | |
|---|---|---|---|
| 7,521,777 B2 * | 4/2009 | Sato et al. ..................... | 257/628 |
| 7,558,305 B2 * | 7/2009 | Botez et al. ................. | 372/43.01 |
| 7,893,424 B2 * | 2/2011 | Eichler et al. .................. | 257/13 |
| 7,902,544 B2 * | 3/2011 | Kim et al. ........................ | 257/13 |
| 7,973,325 B2 * | 7/2011 | Kim et al. ....................... | 257/94 |
| 7,977,683 B2 * | 7/2011 | Moon .............................. | 257/79 |
| 7,977,703 B2 * | 7/2011 | Shakuda ........................ | 257/103 |
| 7,982,205 B2 * | 7/2011 | Wang .............................. | 257/13 |

FOREIGN PATENT DOCUMENTS

| | | |
|---|---|---|
| GB | 2465731 A | 6/2010 |
| JP | 2008-300270 | 12/2008 |
| WO | WO 2009/041688 A1 | 4/2009 |

OTHER PUBLICATIONS

Anikeeva, P.O., et al; "Photoluminescence of CdSe/ZnS core/shell quantum dots enhanced by energy transfer from a phosphorescent donor"; Journal: Chemical Physics Letters—Chem Phys Lett; vol. 424; Apr. 3, 2006; pp. 120-125.

Liu, Hong-Wei, et al.; "Enhanced phosphorescence and electroluminescence in triplet emitters by doping gold into cadmium selenide/zinc sulfide nanoparticles"; Journal: Thin Solid Films; vol. 489; Oct. 1, 2005; pp. 296-302.

* cited by examiner

*Primary Examiner* — Nathan Ha
(74) *Attorney, Agent, or Firm* — Alston & Bird LLP

(57) ABSTRACT

A hybrid LED comprising an anode, an organic hole-transport layer for transporting holes injected into the diode from said anode, a light-emitting quantum dot layer, an electron-transport layer, and a cathode for injecting electrons into said transport layer, wherein the LED also comprises, between said hole- and electron-transport layers, at least one assembly formed by a phosphorescent light-emitting layer presenting an emission spectrum that covers at least part of an absorption spectrum of said quantum dots, and by a buffer layer separating said phosphorescent layer from said quantum dot layer, the material of said or each buffer layer presenting a forbidden band greater than that of a phosphorescent element of said phosphorescent layer so as to prevent excitons diffusing towards said quantum dot layer.

14 Claims, 4 Drawing Sheets

HIGH EFFICIENCY HYBRID LIGHT-EMITTING DIODE

FIELD OF THE INVENTION

The invention relates to a hybrid organic and quantum dot light-emitting diode (LED) presenting high efficiency.

BACKGROUND

Organic LEDs (also known as OLEDs) are optoelectronic components that are the subject of rapid development and that are used essentially in making flat screens.

Whereas a "conventional" LED is made of inorganic semiconductor materials, an OLED is made of layers of organic materials. This leads to fabrication technology that is much simpler and less expensive to implement. In particular, the organic materials constituting OLEDs may be deposited easily on large areas in order to make flat screens at low cost.

FIG. 1 is a diagram for explaining the operation of a very simple OLED constituted by a stack of four layers:
  a transparent anode A, e.g. made of indium tin oxide (ITO) deposited on a substrate S made of glass;
  a hole transport layer HTL, e.g. made of Spiro TTB doped with F4TCNQ, or with $MoO_3$;
  an emitting layer EL, e.g. made of AlQ3 or of TMM004 doped with Irppy;
  an electron transport layer ETL, e.g. made of Bphen doped with Ca or with $CsCo_3$; and
  a reflective cathode, e.g. made of Ag or Al.

The layer HTL conducts holes "h" injected into the structure by the anode; it performs the function of the p-doped layer in conventional LEDs. Conversely, the layer ETL conducts electrons "e" injected into the structure by the cathode; it thus performs the function of the n-doped layer in conventional LEDs. When the electrons and the holes meet within the emitting layer, they form excitons EX, i.e. pairs linked by Coulomb interaction, which may recombine by a radiative process, thereby emitting a photon. The emitted photons leave via the anode and the transparent substrate, possibly after being reflected by the metal cathode ("downward emission"). In a variant, the cathode may be transparent, being constituted by a very fine metal layer, and the anode may be reflective, thus providing a diode having "upward" emission. Blocking layers (not shown) may be provided in order to limit leakage of carriers beyond the light-emitting layer: excitons that are generated close to the electrodes usually recombine in non-radiative manner, thereby reducing the efficiency of the device. This phenomenon is known by the term "quenching".

One of the main drawbacks of OLEDs is the broad spectral width of the radiation they emit, thus making it impossible to obtain colors that are sufficiently saturated.

One solution to that problem consists in using hybrid diodes, including quantum dots that are associated with the organic semiconductor layers.

A quantum dot is a nanoparticle of inorganic semiconductor material of a size that is sufficiently small to enable excitons to be confined in three dimensional space. Typically, a quantum dot is constituted by a core surrounded by a shell of semiconductor material that has a forbidden band that is broader than that of the core. Molecules may be deposited on the shell so as to modulate the chemical and physicochemical properties of the quantum dot, e.g. its ability to remain in suspension in a solvent. Quantum dots are light-emitting and they present an emission band that is relatively narrow compared with organic emitters: when appropriately incorporated as a light-emitting element in an optoelectronic component as a light-emitting element, they therefore enable highly saturated colors to be obtained.

FIG. 2 shows a simplified structure for an organic LED including, between its HTL and ETL, a monolayer BQ of quantum dots. In this device, the HTL and ETL inject holes and electrons respectively into the quantum dots, where those carriers become linked to form excitons. A fraction of the excitons recombine by a radiative process, emitting light of a spectrum that depends exclusively on the properties of the quantum dots, and not on the properties of the organic layers HTL and ETL.

In known manner, it is necessary for the energy levels of the layers HTL and ETL to be adapted to the energy bands of the quantum dots in order to enable carriers to be injected efficiently.

Hybrid organic and quantum dot LEDs and methods of fabricating them are described in detail in the following articles:

Polina O. Anikeeva, Jonathan E. Halpert, Moungi G. Bawendi, Vladimir Bulovic, "Quantum dot light-emitting devices with electroluminescence tunable over the entire visible spectrum", Nano Letters 2009, Vol. 9, No. 7, pp. 2532-2536; and Seth Coe-Sullivan, Jonathan S. Steckel, LeeAnn Kim, Moungi G. Bawendi, Vladimir Bulovic "Method for fabrication of saturated RGB quantum dot light-emitting devices" Proc. SPIE 5739 (2005), pp. 108-115.

The efficiency of such devices is limited by the spin statistics of the carriers. It is well known that excitons come in two forms: singlet states in which the total spin angular momentum is zero (S=0) and triplet states in which the total spin angular momentum is one (S=1). There are three triplet levels for one singlet level; in other words 75% of the excitons are in a triplet state and 25% in a singlet state.

The fundamental state reached after recombination presents a total spin angular momentum that is equal to zero; consequently, symmetry configurations prevent triplet states recombining by an electric dipole transition. As a result, these states present a lifetime that is much longer than that of singlets, and they usually recombine by a non-radiative process. Because of that, in fluorescent materials, only singlet excitons contribute to light emission, so efficiency cannot exceed 25%.

Things are different in phosphorescent materials, where strong spin-orbit coupling induces triplet and singlet states to mix and enables the triplet state to de-excite in radiative manner by inter-system conversion. This effect is sometimes made use of in OLEDs having a phosphorescent emitting layer. Another technique consists in mixing fluorescent molecules with a phosphorescent "sensitizer" in a non-light-emitting organic matrix. Under certain conditions, the triplets of the phosphorescent sensitizer may yield their energy by non-radiative transfer of the Förster type to the fluorescent molecules, that provide the emission of the device. That technique is described in the article by M. A. Baldo, M. E. Thompson, and S. R. Forrest "High-efficiency fluorescent organic light-emitting devices using a phosphorescent sensitizer", Nature 403 (2000), pp. 750-753.

Unfortunately, most quantum dots do not present an efficient inter-system conversion path, thereby limiting the yield of hybrid organic and quantum dot diodes. It is not easy to adapt the technique proposed in the above-mentioned article by M. A. Baldo et al. to such devices.

An article by Polina O. Anikeeva, Jonathan E. Halpert, Moungi G. Bawendi, and Valdimir Bulovic "Photoluminescence of CdSe/ZnS core/shell quantum dots enhanced by energy transfer from a phosphorescent donor", Chemical Physics Letters 424 (2006), pp. 120-125 mentions exciton transfer from a phosphorescent material to quantum dots. That technique is advantageous only for quantum dots that provide efficient inter-system conversion, which is not true in general. In addition, the device described in that article is photoluminescent and not electroluminescent, and it makes use of a thick phosphorescent layer. The use of a layer that is that thick for making an LED would lead to components that consume a large amount of energy.

Another phenomenon limits the yield of hybrid organic and quantum dot LEDs. The efficiency of such devices depends on the capacity of the carriers to occupy the levels of the quantum dots. Unfortunately, there is considerable misalignment between the valance and conduction bands quantum dots and the highest occupied molecular orbitals (HOMOs) and the lowest unoccupied molecular orbitals (LUMOs) of adjacent organic semiconductors. Because of that misalignment, only a small fraction of the pairs that form actually recombine in the quantum dots. That phenomenon is accentuated by the very small thickness of the quantum dot layer BQ, which allows the carriers to escape. The prior art provides no solution to that problem.

SUMMARY

The invention seeks to improve the yield of hybrid organic and quantum dot LEDs.

According to the invention, this object may be achieved by a hybrid LED comprising an anode, an organic hole-transport layer for transporting holes injected into the diode from said anode, a light-emitting quantum dot layer, an electron-transport layer, and a cathode for injecting electrons into said transport layer, wherein the LED also comprises, between said hole- and electron-transport layers, at least one assembly formed by a phosphorescent light-emitting layer presenting an emission spectrum that covers at least part of an absorption spectrum of said quantum dots, and by a buffer layer separating said phosphorescent layer from said quantum dot layer, the material of said or each buffer layer presenting a forbidden band greater than that of a phosphorescent element of said phosphorescent layer so as to prevent excitons diffusing towards said quantum dot layer.

In conventional manner, the light-emitting layer is generally constituted by a transparent matrix into which a phosphorescent element is introduced in the form of a dopant. Nevertheless, under certain circumstances a uniform light-emitting layer may be used: the phosphorescent element then forming all of the layer.

In an LED of the invention, only some of the electrons and holes are injected into the quantum dots in order to form excitons therein (with 25% singlets and 75% triplets).

Other pairs of carriers form excitons inside the phosphorescent light-emitting layer; these excitons—regardless of whether they are in singlet or triplet states—recombine in radiative manner with very high efficiency, emitting photons that can be absorbed by the quantum dots. This results in the quantum dots being pumped optically. The excitons created by optical pumping in the quantum dots are necessarily of the singlet type, and can therefore recombine in radiative manner.

Nevertheless, that scheme cannot function if the phosphorescent layer is directly in contact with the quantum dots. When a phosphorescent acceptor is directly in contact with a phosphorescent donor, non-radiative energy transfer takes place of the Dexter type from the triplet excitons of the donor to the generally triplet type excitons of the acceptor. In other words, phosphorescent emission is eliminated and energy is lost in the form of triplet excitons in the phosphorescent acceptor, which excitons recombine in non-radiative manner. Consequently, an essential element of the invention is a buffer layer that separates the phosphorescent layer from the quantum dot layer, while allowing pumping photons to pass.

The quantum dots have an absorption spectrum that is very broad, covering practically all wavelengths shorter than their emission wavelength. There is thus great latitude in selecting the phosphorescent emitter: it suffices that it emits photons of energy greater than the emission energy of the quantum dots.

In particular embodiments of the invention:
  Said or each buffer layer presents thickness greater than 3 nanometers (nm), in order to be effective in preventing Dexter type energy transfers. Simultaneously, it must not be too thick in order to avoid unfavorably affecting the conductivity of the diode. By way of example, its thickness may lie in the range 10 nm to 30 nm.
  At least one of said anode and said cathode is adapted to reflect the light emitted by said or each phosphorescent layer (in order to improve the efficiency of the optical pumping); and at last one of said anode and said cathode is substantially transparent to the light emitted by said quantum dots (in order to enable said light to be extracted).
  More particularly, the LED may form a single phosphorescent layer that is arranged between said quantum dot layer and that one of said anode and said cathode that is the more reflective for the light emitted by said phosphorescent layer. This arrangement enhances the efficiency of the optical pumping.
  In a variant, the LED may comprise two said assemblies constituted by a phosphorescent light-emitting layer and a respective buffer layer disposed on either side of said light-emitting quantum dot layer.
  Said phosphorescent, buffer, and quantum dot layer(s) may be positioned inside an optical cavity adapted to trap the light emitted by said or each phosphorescent layer but not the light emitted by said light-emitting quantum dots. This arrangement maximizes the efficiency of the optical pumping of the quantum dots.
  In particularly advantageous manner: one of said anode and said cathode is adapted to reflect efficiently the light emitted both by said or each phosphorescent layer and by said quantum dots; and the other one of said anode and said cathode is substantially transparent to the light emitted both by said or each phosphorescent layer and by said quantum dots; a multilayer dielectric mirror ("Bragg grating") adapted to reflect selectively the light emitted by said or each phosphorescent layer being provided to complete said optical cavity.
  When an optical cavity is made, it is advantageous for said quantum dot layer to be positioned at an antinode of the standing wave formed by the light emitted by said or each phosphorescent layer and trapped by said optical cavity. Given that the phosphorescent layer is generally positioned at a node plane of the cavity, the thickness of the buffer layer should preferably enable the quantum dot layer to be well positioned.
  The assembly constituted by said or each phosphorescent light-emitting layer, said or each buffer layer, and the quantum dot layer may be enclosed between an electron blocking layer beside the anode and a hole blocking layer beside the cathode. This makes it possible to concentrate the carriers (electrons and holes) close both to the quantum dots and to the phosphorescent layer, thereby improving the efficiency of electrical and optical pumping. This also limits parasitic emission of light by other layers of the LED.

Said quantum dots may be at least of a type selected from: CdS/ZnS; CdSe/ZnS; ZnSe/CdSe/ZnS; CdSe/ZnS; CdS/ZnS; $Cd_xHg_{1-x}Te$; PbS; InAs/ZnSe; PbSe.

Said or each buffer layer may be made of a material selected from: TMM060 (trade name); TAZ (3-(4-Biphenylyl)-4-phenyl-5-tert-butylphenyl-1,2,4-triazole); BCP (Bathocuproine); Bphen (Bathophenanthroline or 4,7-diphenyl-1,10-phenanthroline); TCTA (4,4',4"-Tris (carbazol-9-yl)triphenylamine); NPB (N,N'-Bis(naphthalen-1-yl)-N,N'-bis(phenyl)benzidine); CBP (4,4'-Bis (carbazol-9-yl)biphenyl); and a mixture of two or more of these materials. TMM060, TAZ, BCP, and Bphen are electron conductors while TCTA, NPB, and CBP are hole conductors. In order to maximize yield, it is preferable for the buffer layer to be constituted by a mixture of at least a first material that conducts electrons and a second material that conducts holes.

Said light-emitting quantum dot layer (BQ) may be adapted to emit infrared radiation, in particular with a wavelength that may reach or even exceed 5 micrometers (μm).

BRIEF DESCRIPTION OF THE DRAWINGS

Other characteristics, details, and advantages of the invention appear on reading the following description made with reference to the accompanying drawings given by way of example and in which, respectively.

DETAILED DESCRIPTION

In the figures, the thicknesses of the various layers are not drawn to scale.

Figure 1:
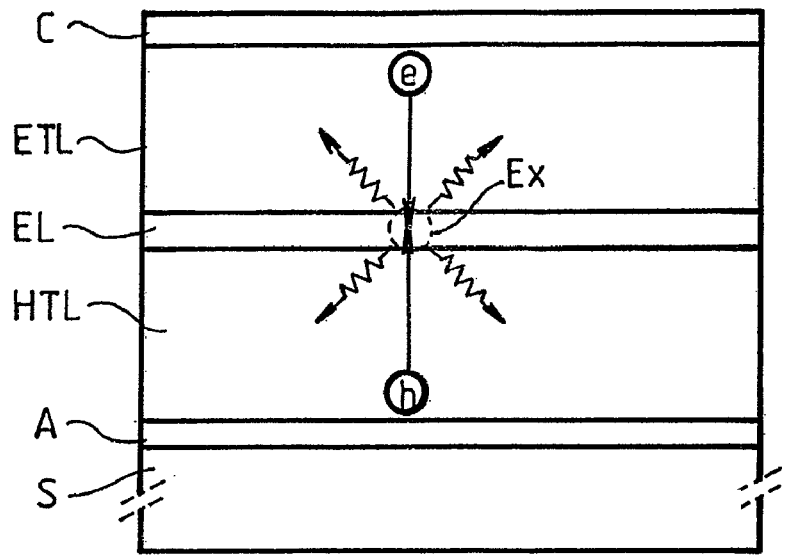
FIG. 1, described above, shows the structure of a conventional OLED.
Figure 2:
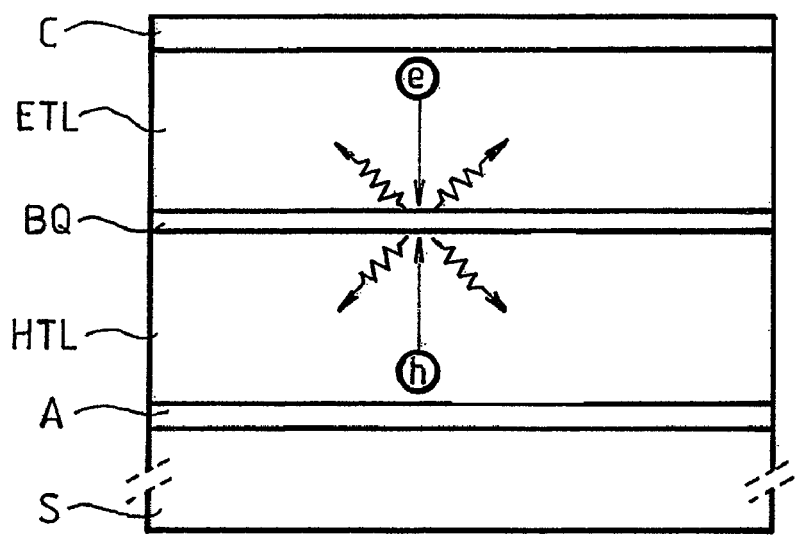
FIG. 2, describes above, shows the structure of a hybrid organic and quantum dot LED known in the prior art.
Figure 3:
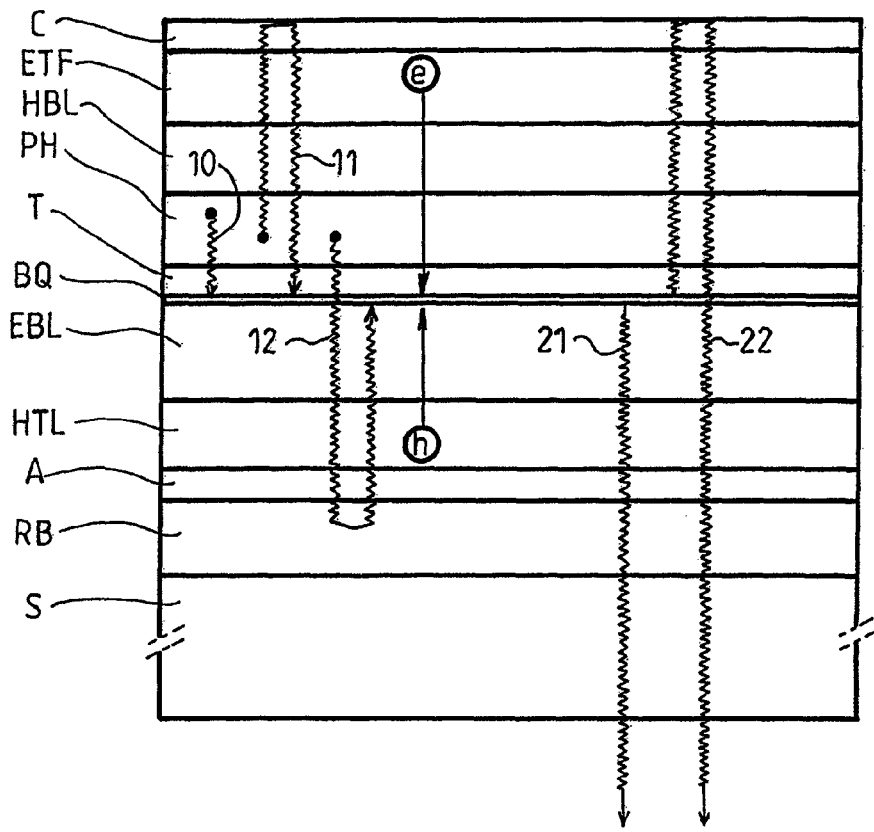
FIG. 3 shows the structure of a hybrid organic and quantum dot LED in a first embodiment of the invention, emitting visible light downwards.

The LED shown in section in FIG. 3 is in the form of a stack of layers on a substrate S made of glass or any other transparent material. Going from the bottom towards the top, there can be seen the following:

A Bragg grating RB formed by alternating dielectric layers of different refractive indices. This Bragg grating is dimensioned to reflect the light emitted by the phosphorescent layer and to pass the light emitted by the quantum dots.

An anode A made of ITO or of a metal layer that is sufficiently thin so as to be substantially transparent to the light emitted by the quantum dot (e.g. 30 nm or less of Ag).

A hole transport layer HTL made of Spiro TTB (2,2',7,7'-tetra(N,N-di-tolyl)amino-spiro-bifluorene) doped with F4TCNQ, (known as 7,7,8,8-Tetracyano-2,3,5,6-tetrafluoroquinodimethane, or as (2,3,5,6-Tetrafluoro-2,5-cyclohexadiene-1,4-diylidene) dimalononitrile), or with $MoO_3$ (typically having a thickness of 20 nm to 200 nm).

An electron blocking layer EBL of Spiro TAD (2,2',7,7'-tetrakis(N,N-diphenylamino)-9',9'-spirobifluorene) or NPB (typically having a thickness 3 nm to 20 nm).

A monolayer BQ of quantum dots that emit in the visible.

A buffer layer T (typically 3 nm to 30 nm thick) of TMM060 doped with TCTA typically at 25% by weight. Because of its small thickness, this buffer layer is substantially transparent to the radiation emitted by the phosphorescent layer. It may also be selected so as to minimize absorption of said radiation.

A phosphorescent light-emitting layer made of TMM004 doped with Irppy (Tris(2-phenylpyridine)iridium(III)), e.g. emitting in the green and in any event at a wavelength lying in the absorption spectrum of the quantum dot (typically having a thickness of 3 nm to 20 nm). Because of the width of the absorption spectrum band of quantum dots, the choice of phosphorescent emitter is not critical. Numerous organometallic compounds with a central heavy metal (in particular a lanthanide) are suitable for implementing the invention.

A hole barrier layer HBL of Bphen or BCP or Alq3 (Tris-(8-hydroxyquinoline)aluminum) or TPBi (2,2',2"-(1,3,5-Benzinetriyl)-tris(1-phenyl-1-H-benzimidazole)) or BAlq3 (Bis-(2-methyl-8-quinolinolate)-4-(phenylphenolato)aluminum) (typically having a thickness 20 nm to 200 nm).

An electron transport layer ETL of Bphen doped with Ca or Bphen doped with $CsCO_3$.

A reflecting cathode C, e.g. made of Ag, Al, Ca/Ag, Ca/Al, or Ba/Al.

In general, if the underlying layers are deposited using a wet process, the quantum dot layer BQ is also deposited using a wet process, in particular using spin coating or ink jet printing. Otherwise (in particular if the underlying layers are constituted by small molecules deposited by thermal evaporation), it is preferable to deposit the layer BQ by microcontact printing in order to avoid solvation of the underlying layers.

The quantum dots of the layer BQ are pumped optically by photons emitted by the phosphorescent layer PH. By way of example, reference 10 designates a pump photon that is absorbed directly by a quantum dot; reference 11 designates a photon that is absorbed after being emitted in a direction opposite to that of the quantum dot and after being reflected by the metal cathode; and reference 12 designates a photon that is absorbed after passing through the layer BQ a first time and after being reflected by the cathode C.

The quantum dots are thus pumped electrically by injecting electrons "e" and holes "h" coming from the electrodes.

Reference 21 designates a photon emitted by a quantum dot towards the anode and the substrate. Since these elements are transparent, the photon can pass through them (downward emission). Reference 22 designates a photon emitted in the opposite direction, which photon is reflected by the cathode before, in turn, leaving the device through the substrate.

Figure 4:
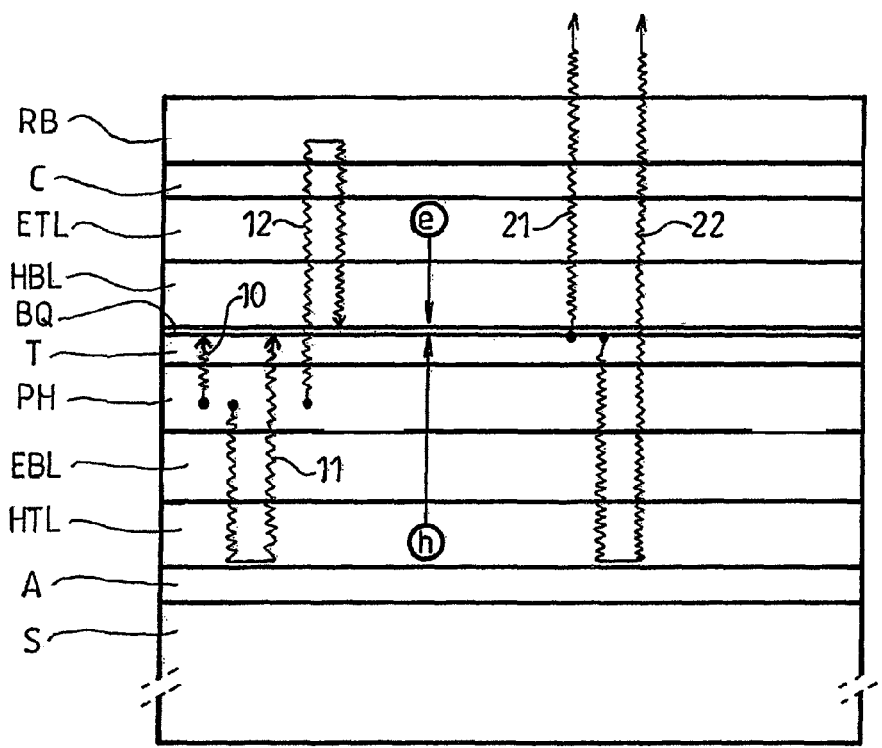
FIG. 4 shows the structure of a hybrid organic and quantum dot LED in a second embodiment of the invention, emitting visible light upwards.

FIG. 4 shows an LED emitting visible light, but "upwards", i.e. through its surface opposite from its substrate.

In this embodiment, the anode is reflective, e.g. made of Al/TiN, Al/W, Al/Mo, W, or Mo, and it is deposited directly on the substrate. It is the cathode that needs to be transparent: it may be constituted by a thin layer (typically less than 30 nm thick) made of Ag, Al, Ca/Ag, Ca/Al, or Ba/Al. The substrate may be of glass or any other appropriate material, since it no longer needs to be transparent.

The Bragg grating RB is deposited on the cathode. Under the grating, it is possible to have a so-called "capping" layer of SiO, $MoO_3$, ZnSe, $TeO_2$, or $Sb_2O_3$, for example, serving to increase the flux extracted from the diode. In a variant, the Bragg grating may be designed so as to perform this role as well.

It should be observed that the order of the layers is different, since in this device the phosphorescent layer PH is located beside the anode that constitutes the more reflective mirror of the optical cavity formed by the anode itself and by the Bragg grating. This arrangement (which is not essential but is strongly recommended) optimizes the efficiency of the optical pumping of the quantum dot.

Figure 5:
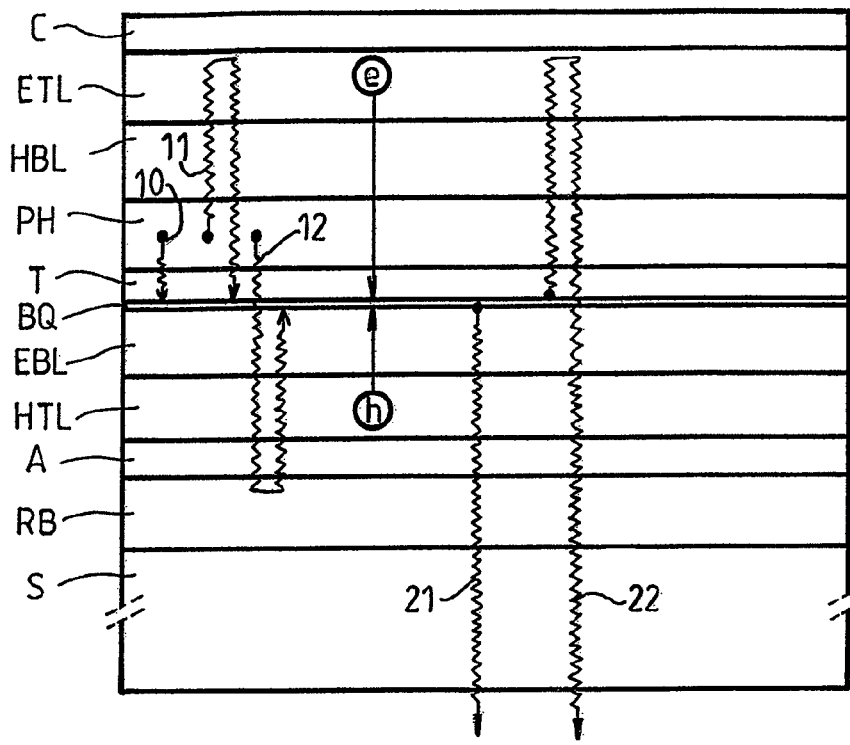
FIG. 5 shows the structure of a hybrid organic and quantum dot LED in a third embodiment of the invention, emitting infrared light downwards.

The LED of FIG. 5 is adapted to emit infrared radiation "downwards", i.e. through its substrate. This substrate may be made of silicon, a material that is transparent in this region of the spectrum at wavelengths up to about 8 μm.

The arrangement of the layers is the same as in FIG. 3:

As before, the Bragg grating RB is dimensioned to reflect the light emitted by the phosphorescent layer and to pass the light emitted by the quantum dots.

The anode A is constituted by a thin metal layer, e.g. 20 nm or less of Ag, W, or Mo. In a variant, it could equally be constituted by a metal grid in order to extract more photons.

The hole-transport layer HTL, made of Spiro TTB doped with F4TCNQ or with $MoO_3$, presents thickness lying in the range 10 nm to 100 nm.

The electron-blocking layer EBL made of Spiro TAD or NPB presents thickness lying in the range 3 nm to 20 nm.

The monolayer BQ is constituted by quantum dots emitting in the infrared and absorbing the visible light emitted by the phosphorescent layer.

The buffer layer T of TMM060 doped with TCTA presents thickness lying in the range 3 nm to 30 nm.

The phosphorescent light-emitting layer of TMM004 doped with Irppy presents thickness lying in the range 10 nm to 20 nm and, for example, it emits in the green.

The hole-blocking layer HBL made of Bphen or BCP or Alq3 or TPBi or BAq3 presents thickness lying in the range 3 nm to 20 nm.

The electron transport layer ETL made of Bphen doped with Ca or Bphen doped with $CsCO_3$ presents thickness lying in the range 10 nm to 100 nm.

The reflective cathode C may be made of Ag or Al and may present thickness greater than 100 nm in order to be sufficiently reflective.

In a variant, the phosphorescent layer and the buffer layer may be arranged beside the anode. In any event, the buffer layer must separate the phosphorescent layer from the quantum dots.

Figure 6:
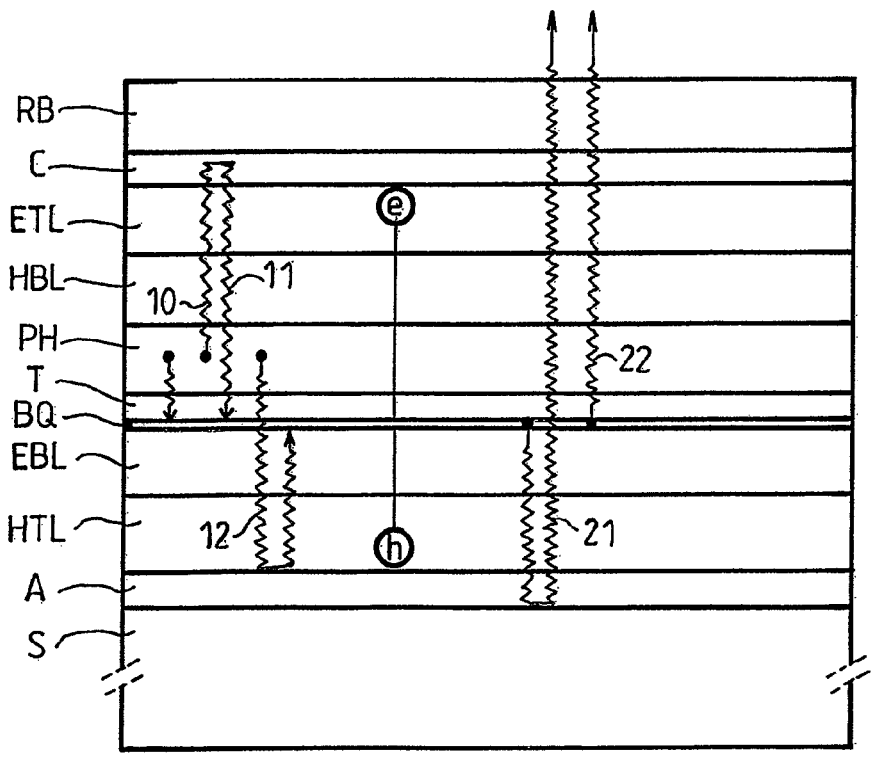
FIG. 6 shows the structure of a hybrid organic and quantum dot LED in a fourth embodiment of the invention emitting infrared light upwards.
Figure 7:
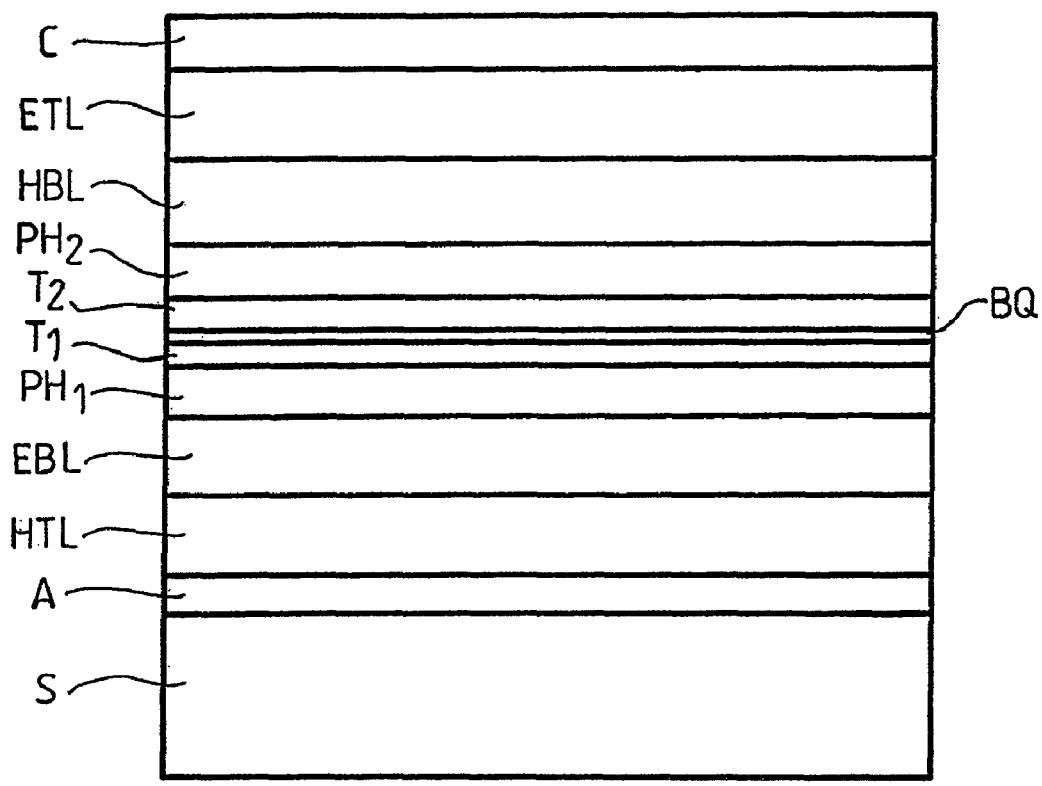
FIG. 7 shows the structure of a hybrid organic and quantum dot LED in a fifth embodiment of the invention, having two phosphorescent layers and two respective buffer layers disposed on either side of the quantum dot layer.

The diode of FIG. 6 emits upwards. It differs from that of FIG. 5 solely in the order of its layers.

It is also possible to envisage using two phosphorescent layers $PH_1$ and $PH_2$ (possibly made of different materials), that are arranged on either side of the quantum dot layer and that are separated therefrom by respective buffer layers $T_1$ and $T_2$.

It should be understood that the examples given herein are not limiting. Materials other than those listed may be used, and the thicknesses of the layers are given purely by way of indication. Furthermore, the electron and hold blocking layers may be omitted, or the transport layers may also perform their function. The Bragg grating is merely a particularly advantageous embodiment of a wavelength-selective mirror. Furthermore, the use of an optical cavity is not essential, even though it is particularly advantageous.

What is claimed is:

1. A hybrid LED comprising an anode, an organic hole-transport layer for transporting holes injected into the diode from said anode, a light-emitting quantum dot layer, an electron-transport layer, and a cathode for injecting electrons into said transport layer, wherein the LED also comprises, between said hole- and electron-transport layers, at least one assembly formed by a phosphorescent light-emitting layer presenting an emission spectrum that covers at least part of an absorption spectrum of said quantum dots, and by a buffer layer separating said phosphorescent layer from said quantum dot layer, the material of said or each buffer layer presenting a forbidden band greater than that of a phosphorescent element of said phosphorescent layer so as to prevent excitons diffusing towards said quantum dot layer.

2. A hybrid LED according to claim 1, wherein said or each buffer layer presents thickness greater than 3 nm.

3. A hybrid LED according to claim 2, wherein said or each buffer layer presents thickness lying in the range 10 nm to 30 nm.

4. A hybrid LED according to claim 1, wherein at least one of said anode and said cathode is adapted to reflect the light emitted by said or each phosphorescent layer; and at last one of said anode and said cathode is substantially transparent to the light emitted by said quantum dots.

5. A hybrid LED according to claim 4, having a single phosphorescent layer that is arranged between said quantum dot layer and that one of said anode and said cathode that is the more reflective for the light emitted by said phosphorescent layer.

6. A hybrid LED according to claim 1, having two said assemblies constituted by a phosphorescent light-emitting layer and a respective buffer layer disposed on either side of said light-emitting quantum dot layer.

7. A hybrid LED according to claim 1, wherein said phosphorescent, buffer, and quantum dot layer(s) are positioned inside an optical cavity adapted to trap the light emitted by said or each phosphorescent layer but not the light emitted by said light-emitting quantum dots.

8. A hybrid LED according to claim 6, wherein:

one of said anode and said cathode is adapted to reflect efficiently the light emitted both by said or each phosphorescent layer and by said quantum dots; and the other one of said anode and said cathode is substantially transparent to the light emitted both by said or each phosphorescent layer and by said quantum dots; a multilayer dielectric mirror adapted to reflect selectively the light emitted by said or each phosphorescent layer being provided to complete said optical cavity.

9. A hybrid LED according to claim 7, wherein said quantum dot layer is positioned at an antinode of the standing wave formed by the light emitted by said or each phosphorescent layer and trapped by said optical cavity.

10. A hybrid LED according to claim 1, wherein the assembly constituted by said or each phosphorescent light-emitting layer, said or each buffer layer, and the quantum dot layer is enclosed between an electron blocking layer beside the anode and a hole blocking layer beside the cathode.

11. A hybrid LED according to claim 1, wherein said quantum dots are at least of a type selected from: CdS/ZnS; CdSe/ZnS; ZnSe/CdSe/ZnS; CdSe/ZnS; CdS/ZnS; $Cd_xHg_{1-x}Te$; PbS; InAs/ZnSe; PbSe.

12. A hybrid LED according to claim 1, wherein said or each buffer layer is made of a material selected from the group consisting of: TMM060; TAZ; BCP; Bphen; TCTA; NPB; CBP; and a mixture of two or more of these materials.

13. A hybrid LED according to claim 1, wherein said or each buffer layer is constituted by a mixture of at least a first material that conducts electrons and a second material that conducts holes.

14. A hybrid LED according to claim 1, wherein said light-emitting quantum dot layer is adapted to emit infrared radiation.

* * * * *